US010938607B2

(12) United States Patent
Shen (10) Patent No.: US 10,938,607 B2
(45) Date of Patent: Mar. 2, 2021

(54) RANDOM ACCESS MEMORY (71) Applicant: Changxin Memory Technologies, Inc., Anhui (CN)

(72) Inventor: Jian Hung Shen, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 16/862,384

(22) Filed: Apr. 29, 2020

(65) Prior Publication Data
US 2020/0259686 A1 Aug. 13, 2020

Related U.S. Application Data (63) Continuation of application No. PCT/CN2018/112907, filed on Oct. 31, 2018.

(30) Foreign Application Priority Data

Nov. 1, 2017 (CN) .......................... 201711060125.3

(51) Int. Cl.
H03F 3/193 (2006.01)
H03F 3/45 (2006.01)
(Continued)

(52) U.S. Cl.
CPC ...... *H04L 25/03878* (2013.01); *G11C 7/1084* (2013.01); *G11C 7/1093* (2013.01);
(Continued)

(58) Field of Classification Search
CPC ......... H04L 25/03878; H04L 25/03267; G11C 7/1084; G11C 7/1093; G11C 7/222; G11C 2207/107
(Continued)

(56) References Cited

U.S. PATENT DOCUMENTS 8,396,110 B1* 3/2013 Hsieh ................ H04L 25/03057
375/233
9,397,623 B1* 7/2016 Lacroix ............ H04L 25/03885
(Continued)

FOREIGN PATENT DOCUMENTS

CN 101595699 A 12/2009
CN 102143104 A 8/2011
(Continued)

OTHER PUBLICATIONS

PCT International Search Report and the Written Opinion dated Jan. 30, 2019, issued in related International Application No. PCT/CN2018/112907 (9 pages).
(Continued)

Primary Examiner — Ly D Pham
(74) Attorney, Agent, or Firm — Sheppard Mullin Richter & Hampton LLP (57) ABSTRACT A random access memory (RAM) including a deserializer is disclosed. The RAM further comprises a continuous-time linear equalizer (CTLE) including a first input terminal that receives an input signal for the RAM and a first output terminal communicatively connected to the deserializer, the CTLE configured to perform a channel gain compensation on the input signal received by the first input terminal and to transmit the compensated input signal to the deserializer. The RAM may further comprise a decision feedback equalizer (DFE) including a second input terminal communicatively connected to the CTLE and a second output terminal communicatively connected to the deserializer, the DFE configured to reduce an inter-symbol interference (ISI) of the input signal.

17 Claims, 6 Drawing Sheets (51) Int. Cl.
  *H03K 17/16* (2006.01)
  *H04L 25/40* (2006.01)
  *H04L 7/00* (2006.01)
  *H04L 25/03* (2006.01)
  *H04B 10/50* (2013.01)
  *G11C 7/10* (2006.01)
  *G11C 7/22* (2006.01)
  *H04B 10/2507* (2013.01)
  *H04L 25/14* (2006.01)

(52) U.S. Cl.
  CPC ........ *G11C 7/222* (2013.01); *H04L 25/03267* (2013.01); *G11C 2207/107* (2013.01); *H03F 3/193* (2013.01); *H04B 10/2507* (2013.01); *H04L 25/03057* (2013.01); *H04L 25/03114* (2013.01); *H04L 25/03159* (2013.01); *H04L 25/14* (2013.01)

(58) Field of Classification Search
  USPC .................................................. 365/189.011
  See application file for complete search history.

(56) References Cited

U.S. PATENT DOCUMENTS

| | | | |
|---|---|---|---|
| 9,397,824 B1 | 7/2016 | Hoshyar et al. | |
| 9,444,656 B2* | 9/2016 | Ding | H04L 25/03038 |
| 9,589,626 B1 | 3/2017 | Liu et al. | |
| 10,027,297 B2* | 7/2018 | Yuan | H03G 1/0029 |
| 2005/0180498 A1* | 8/2005 | Bhakta | H04L 25/03057 |
| | | | 375/233 |
| 2006/0109929 A1* | 5/2006 | Tripathi | H04L 25/14 |
| | | | 375/272 |
| 2012/0153936 A1* | 6/2012 | Romani | G01R 33/06 |
| | | | 324/202 |
| 2015/0312060 A1* | 10/2015 | Sinha | H04L 25/14 |
| | | | 375/233 |
| 2016/0006589 A1* | 1/2016 | Kamali | H04L 25/03343 |
| | | | 375/232 |
| 2016/0170243 A1* | 6/2016 | Bergmann | G02F 1/0327 |
| | | | 359/257 |
| 2016/0218889 A1 | 7/2016 | Zheng et al. | |
| 2017/0085239 A1* | 3/2017 | Yuan | H04L 25/03878 |
| 2017/0118046 A1* | 4/2017 | Dallaire | H04L 25/03006 |
| 2017/0126443 A1* | 5/2017 | Gu | H04L 25/03878 |
| 2017/0222840 A1* | 8/2017 | Malhotra | H04L 25/03057 |
| 2018/0048494 A1* | 2/2018 | Mobin | H04L 25/03057 |
| 2018/0152327 A1 | 5/2018 | Lee et al. | |
| 2018/0316356 A1* | 11/2018 | Moballegh | H03L 7/0807 |
| 2019/0312759 A1* | 10/2019 | Chen | H04L 25/03057 |
| 2020/0027518 A1* | 1/2020 | Caraher | G11C 29/12015 |

FOREIGN PATENT DOCUMENTS

| | | |
|---|---|---|
| CN | 102801667 A | 11/2012 |
| CN | 203434996 U | 2/2014 |
| CN | 106448719 A | 2/2017 |
| CN | 106940683 A | 7/2017 |
| CN | 107657978 A | 2/2018 |
| CN | 207441243 U | 6/2018 |

OTHER PUBLICATIONS

First Search dated Mar. 22, 2018, issued in related Chinese Patent Application No. 201711060125.3 (2 pages).
Supplementary Search dated May 30, 2018, issued in related Chinese Patent Application No. 201711060125.3 (1 page).
Second Office Action dated Jun. 8, 2018, issued in related Chinese Patent Application No. 201711060125.3, with English machine translation (12 pages).

* cited by examiner

RANDOM ACCESS MEMORY

CROSS-REFERENCE TO RELATED APPLICATION

This application is a continuation application of International Patent Application No. PCT/CN2018/112907, filed on Oct. 31, 2018, which claims priority to China Patent Application No. 201711060125.3, filed with the China Patent Office on Nov. 1, 2017 and entitled "RANDOM ACCESS MEMORY." The above-referenced applications are incorporated herein by reference in their entirety.

TECHNICAL FIELD

The present disclosure relates to memory devices and, in particular, to a random access memory (RAM).

BACKGROUND

A random access memory (RAM) is an internal memory that exchanges data directly with the CPU. It can be read and written as desired at a fast speed and is usually used as a transitory data storage medium for the operating system or other programs that are running.

Currently, RAM's specification demands high signal transmission speed. However, at high transmission speed, signals received by RAM tend to be distorted and not very reliable.

SUMMARY

The present disclosure provides a random access memory (RAM), e.g., a double-data-rate dynamic RAM which supports high-speed data transmission with high reliability.

According to one aspect, a RAM may comprise a deserializer, and a continuous-time linear equalizer (CTLE) including a first input terminal that receives an input signal for the RAM and a first output terminal communicatively connected to the deserializer, the CTLE configured to perform a channel gain compensation on the input signal received by the first input terminal and to transmit the compensated input signal to the deserializer.

In some embodiments, the CTLE may be an active CTLE comprising a CTLE circuit comprising:

a first branch circuit, comprising a first resistor, a first transistor, a second transistor and a positive pole of the first input terminal of the CTLE, one end of the first resistor connected to a source of the first transistor, the first transistor having a gate connected to the positive pole of the first input terminal, the first transistor having a drain connected to a source of the second transistor, the second transistor having a drain that is grounded;

a second branch circuit, comprising a second resistor, a third transistor, a fourth transistor and a negative pole of the first input terminal of the CTLE, one end of the second resistor connected to a source of the third transistor, the third transistor having a gate connected to the negative pole of the first input terminal, the third transistor having a drain connected to a source of the fourth transistor, the fourth transistor having a drain that is grounded; and a first controller, connected both to a gate of the second transistor and to a gate of the fourth transistor.

In some embodiments, the CTLE circuit may further comprise:

a fifth transistor, having a source connected to the first branch circuit through the first connection node located between the first and second transistors, and a drain connected to the second branch circuit through the second connection node located between the third and fourth transistors; and a second controller, connected to a gate of the fifth transistor.

In some embodiments, the CTLE may be configured to improve performance of an eye diagram (a pattern diagram observed on an oscilloscope during experimental estimation and amelioration of the performance of a transmission system) of the input signal through a linear fitting of channel attenuation levels of the input signal.

In some embodiments, the CTLE circuit may further comprise:

a third resistor, where one end of the third resistor is connected to the first branch circuit through a first connection node located between the first and second transistors, and the other end of the third resistor is connected to the second branch circuit through a second connection node located between the third and fourth transistors.

In some embodiments, the CTLE circuit may further comprise:

a positive pole of the first output terminal, connected to the second branch circuit through a third connection node located between the second resistor and the third transistor; and a negative pole of the first output terminal, connected to the first branch circuit through a fourth connection node located between the first resistor and the first transistor.

In some embodiments, the RAM may further comprise: a decision feedback equalizer (DFE) including a second input terminal communicatively connected to the CTLE and a second output terminal communicatively connected to the deserializer, the DFE configured to reduce an inter-symbol interference (ISI) of the input signal.

In some embodiments, the RAM may further comprise:

a data slicer having an input terminal connected to the output terminal of the CTLE, the data slicer also having an output terminal connected to the input terminal of the DFE, the data slicer configured to quantify the input signal;

a clock and data recovery (CDR) circuit having an input terminal connected to an output terminal of the deserializer, the CDR circuit configured to extract phase information from the input signal; and a phase-locked loop (PLL) having an input terminal communicatively connected to an output terminal of the CDR circuit, and an output terminal communicatively connected to both the data slicer and the DFE, the PLL configured to control phase synchronization of different signals output by the CDR circuit.

In some embodiments, the DFE may comprise: a first delay unit having an input terminal connected to the second input terminal, the first delay unit configured to delay the input signal by predetermined numbers of unit time intervals to obtain a plurality of delayed signals.

In some embodiments, the DFE may further comprise:

a first weighting unit having an input terminal connected to an output terminal of the first delay unit, the first weighting unit configured for weighting the delayed input signals;

a weight setting unit connected to the first weighting unit, the weight setting unit having an input terminal connected to the second input terminal, the weight setting unit configured to receive the input signal and set weights used by the first weighting unit in weighting the delayed signals; and an adder having an input terminal connected to an output terminal of the first weighting unit, the adder configured to sum the weighted delayed signals to obtain a summed signal.

In some embodiments, the DFE may further comprise:

a decision-making unit having an input terminal connected to an output terminal of the adder, the decision-making unit configured to determine an ISI of the summed signal obtained from the adder and eliminate the ISI from the summed signal to obtain an ISI free signal; and an error calculating unit having an input terminal connected both to an output terminal of the decision-making unit and to the output terminal of the adder, the error calculating unit also having an output terminal connected to the weight setting unit, the error calculating unit configured to calculate a difference between the summed signal obtained from the adder and the ISI free signal obtained from the decision-making unit, and to adjust, based on the difference, the weights set by the weight setting unit for the first weighting unit.

In some embodiments, the DFE may further comprise:

a second delay unit having an input terminal connected to the output terminal of the decision-making unit, the second delay unit configured to delay the ISI free signal obtained from the decision-making unit by predetermined numbers of unit time intervals to obtain a plurality of delayed ISI free signals; and a second weighting unit having an input terminal connected to the output terminal of the second delay unit, the second weighting unit also having an output terminal connected both to the input terminal of the adder and to the weight setting unit, the second weighting unit configured to weight the delayed ISI free signals, wherein the adder is also configured to sum the signals output by the second weighting unit.

According to another aspect, a RAM may comprise a deserializer and:

a continuous-time linear equalizer (CTLE) including a first input terminal that receives an input signal for the RAM and a first output terminal communicatively connected to the deserializer, the CTLE configured to perform a channel gain compensation on the input signal received by the first input terminal and to transmit the compensated input signal to the deserializer, wherein the CTLE is an active CTLE comprising a CTLE circuit, the CTLE circuit comprising:

a first branch circuit, comprising a first resistor, a first transistor, a second transistor and a positive pole of the first input terminal of the CTLE, one end of the first resistor connected to a source of the first transistor, the first transistor having a gate connected to the positive pole of the first input terminal, the first transistor having a drain connected to a source of the second transistor, the second transistor having a drain that is grounded;

a second branch circuit, comprising a second resistor, a third transistor, a fourth transistor and a negative pole of the first input terminal of the CTLE, one end of the second resistor connected to a source of the third transistor, the third transistor having a gate connected to the negative pole of the first input terminal, the third transistor having a drain connected to a source of the fourth transistor, the fourth transistor having a drain that is grounded;

a first controller, connected both to a gate of the second transistor and to a gate of the fourth transistor;

a first varactor diode, having a negative terminal connected to the first branch circuit through the first connection node located between the first and second transistors;

a second varactor diode, having a negative terminal connected to the second branch circuit through the second connection node located between the third and fourth transistors; and a third controller, connected both to a positive terminal of the first varactor diode and to a positive terminal of the second varactor diode.

In some embodiments, each of the first and the second varactor diodes comprises an electric transistor.

According to yet another aspect, a random access memory (RAM) comprising a deserializer may further comprises:

a decision feedback equalizer (DFE) including an input terminal that receives an input signal for the RAM and an output communicatively connected to the deserializer, the DFE configured to reduce an inter-symbol interference (ISI) of the input signal.

According to yet another aspect, a method implemented by a RAM may comprise: receiving an input signal; performing a channel gain compensation on the input signal; and reducing an inter-symbol interference (ISI) from the compensated input signal.

In some embodiments, reducing the ISI of the compensated input signal comprises: delaying the input signal by predetermined numbers of unit time intervals to obtain a plurality of delayed input signals; weighting the delayed input signals based on weight vectors; and summing the weighted delayed input signals to obtain a summed signal.

In some embodiments, reducing the ISI of the compensated input signal comprises: determining an ISI of the summed signal; and eliminating the ISI from the summed signal to obtain a ISI free signal.

In some embodiments, reducing the ISI of the compensated input signal comprises: calculating a difference between the summed signal and the ISI free signal; and adjusting the weight vectors based on the difference.

In some embodiments, reducing the ISI of the compensated input signal comprises: delaying the ISI free signal by predetermined numbers of unit time intervals to obtain a plurality of delayed ISI free signals; weighting the delayed ISI free signals based on the adjusted weight vectors; and summing the weighted delayed ISI free signals.

The CTLE and DFE in the RAM of the present disclosure not only ensure high reliability of signal undergoing high-speed transmission but also reduce ISI from the high-speed signal during its storage on the RAM. As a result, reliable and high-speed signal without distortion is obtained. Therefore, the RAM has an improved performance in high-speed signal transmission.

The preceding summary is for the purpose of illustration only and is not intended to be limiting in any sense. Other aspects, embodiments and features than the above illustrative aspects, embodiments and features will become readily apparent from the following detailed description which is to be read in connection with the accompanying drawings.

BRIEF DESCRIPTION OF THE DRAWINGS

Throughout the following accompanying drawings which are not necessarily drawn to scale, same reference numerals indicate the same or analogous components or elements, unless otherwise defined. It is to be understood that these drawings depict only several embodiments of the present disclosure and should not be considered as limiting the scope thereof.

List of Reference Numerals in FIGS. 1-5 is provided below.

| 110 | CTLE |
|---|---|
| 120 | Deserializer (Des) |
| 130 | DFE |
| 131 | first delay unit |
| 132 | first weighting unit |
| 133 | weight setting unit |
| 134 | adder |
| 135 | decision-making unit |
| 136 | error calculating unit |
| 137 | second delay unit |
| 138 | second weighting unit |
| 140 | data slicer |
| 150 | CDR circuit |
| 160 | PLL |

Figure 3:
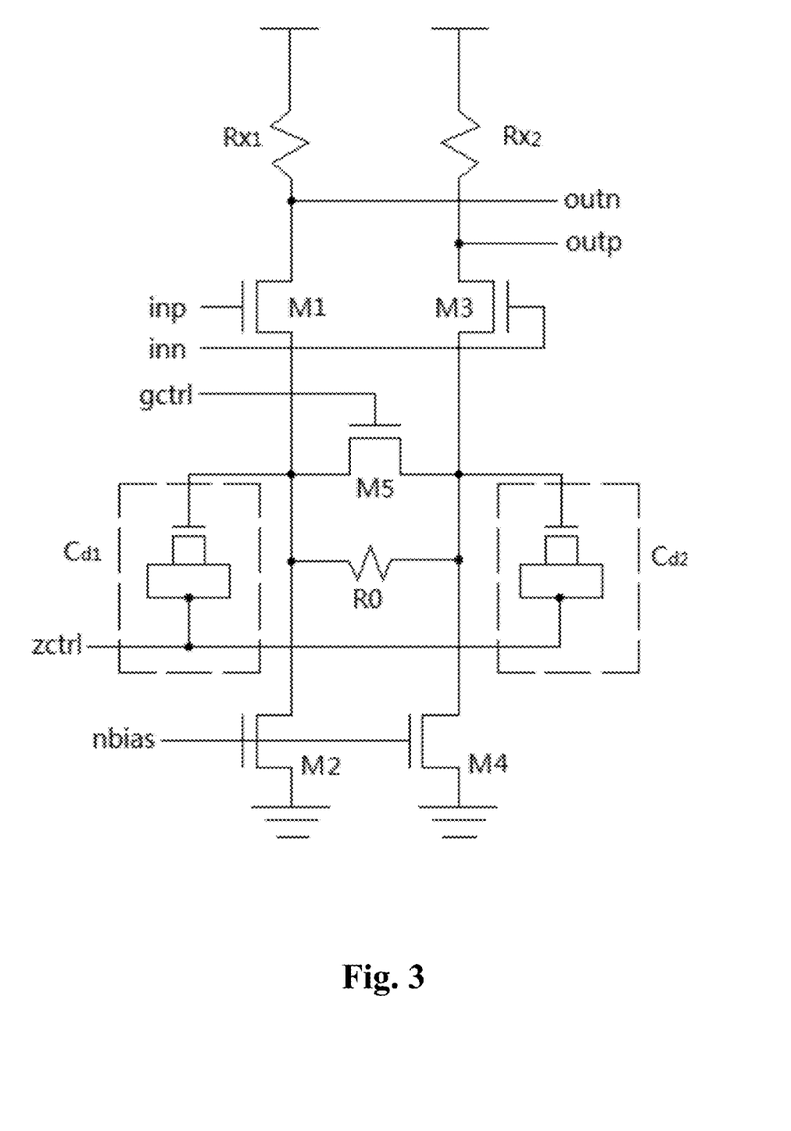
FIG. 3 is a structure diagram of a continuous-time linear equalizer (CTLE) circuit according to various embodiments of the present disclosure.

List of Reference Numerals in FIG. 3 is provided below.

| nbias | first controller |
|---|---|
| Rx1 | first resistor |
| M1 | first transistor |
| M2 | second transistor |
| Rx2 | second resistor |
| M3 | third transistor |
| M4 | fourth transistor |
| inp | positive terminal of first input |
| inn | negative terminal of first input |
| outp | positive terminal of first output |
| outn | negative terminal of first output |
| M5 | fifth transistor |
| gctrl | second controller |
| RO | third resistor |
| zctrl | third controller |
| Cd1 | first varactor |
| Cd2 | second varactor |

DETAILED DESCRIPTION

Briefly described below are merely certain exemplary embodiments. As will be recognized by those skilled in the art, the embodiments disclosed herein may be modified in various manners without departing from the spirit or scope of the disclosure. Accordingly, the accompanying drawings and description are to be regarded as intrinsically exemplary rather than limiting.

In this specification, the directional and positional terms "central", "longitudinal", "transverse", "lengthwise", "widthwise", "thickness-wise", "upper", "lower", "front", "rear", "left", "right", "vertical", "horizontal", "top", "bottom", "inner", "outer", "clockwise", "counterclockwise", "axial", "radial", "circumferential", etc. are meant to be used with respect to the drawings. They are intended merely to facilitate and simplify the explanation of the disclosure and do not indicate or imply that the descried components or elements have to be constructed or operated in the particular orientations. Therefore, they are not to be construed as limiting the disclosure.

In addition, the terms "first", "second", etc., are used herein only for the purpose of illustration and are not to be construed as indicating or implying relative importance or the number of the described technical features. Therefore, a feature described by "first", "second" or the like can explicitly or implicitly indicate one or more such features. Further, the term "plurality" refers to "two or more", unless the context clearly indicates otherwise.

In this specification, unless defined or limited otherwise, the terms "attached" "coupled", "connected", "fixed" or any variant thereof, should be construed in a broad sense to encompass any connection established between two components including, e.g., fixedly, detachably or integrally connected; mechanically, electrically or communicatively connected; directly connected or via an intermediate medium connected; connected through an internal communication or through an external interaction. For those of ordinary skill in the art, the aforementioned terms can be interpreted based on their context herein.

In this specification, unless defined or limited otherwise, when a first feature is described as being "on" or "under" a second feature, the first feature can be in direct contact with the second feature, or be in contact with the second feature through additional elements. Moreover, when a first feature is described as being "over", "overlying" or "above" a second feature, the first feature may either be situated right over or obliquely over the second feature, or be located at a horizontal level higher than the horizontal level at which the second feature is located. Similarly, when a first feature is described as being "under", "underlying" or "beneath" a second feature, the first feature may either be situated right under or obliquely under the second feature, or be located at a horizontal level lower than the horizontal level at which the second feature is located.

The following disclosure provides many different embodiments or examples for implementing different features of the disclosure. These examples of components and arrangements are described in detail below. These are merely examples and are not intended to be limiting the present disclosure. In addition, the present disclosure may repeat reference numerals and/or letters in the various examples. This repetition is for the purpose of simplicity and clarity and does not in itself limits a relationship between the various embodiments and/or configurations described herein. Further, although the disclosure provides examples of various particular processes and materials, those of ordinary skill in the art should recognize other processes and/or other materials may be used.

Figure 1:
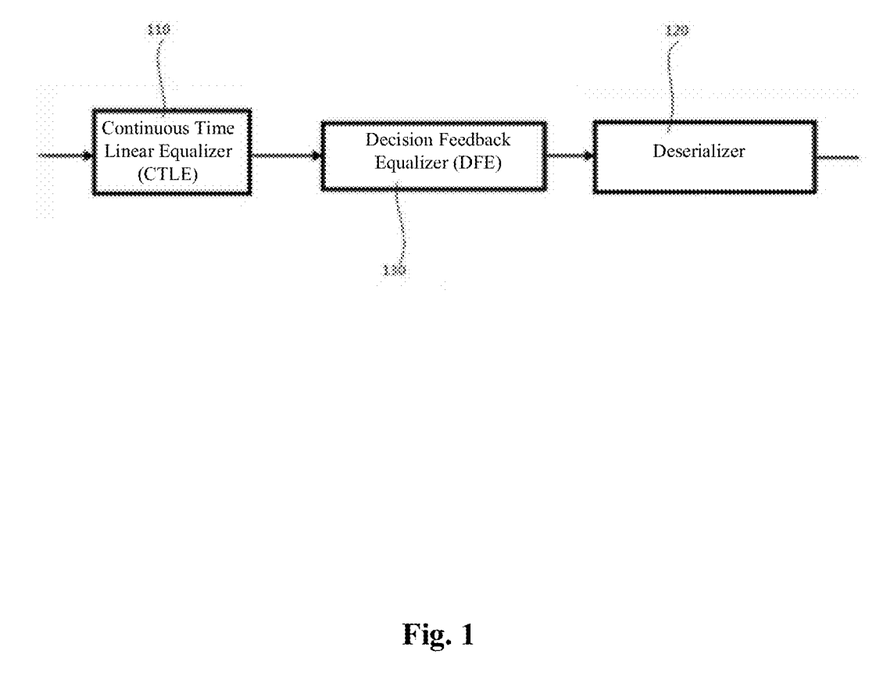
FIG. 1 is a block diagram illustrating an exemplary RAM according to various embodiments of the present disclosure.

Referring to FIG. 1, a simplified circuit diagram illustrating an exemplary RAM is provided according to various embodiments of the present disclosure. As shown in FIG. 1, the random access memory (RAM) includes a deserializer 120 as well as:

a continuous time linear equalizer (CTLE) 110 including a first input terminal that receives input signals for the RAM and a first output terminal communicatively connected to the deserializer 120, where the CTLE 110 is configured to perform channel gain compensation on signals received by the first input terminal and to transmit the compensated signals to the deserializer 120;

a decision feedback equalizer (DFE) 130 including a second input terminal communicatively connected to the CTLE 110 and a second output terminal communicatively connected to the deserializer 120, where the DFE 130 is configured to reduce inter-symbol interference (ISI) of the input signals.

In the illustrated embodiments of FIG. 1, the CTLE 110 and the DFE 130 are provided in the RAM. The CTLE 110 ensures a good eye diagram to be plotted at a receiver when a high-speed signal is transmitted from the RAM. As a result, the CTLE 110 allows the correct reception of the high-speed signal and thus improves the speed of the overall signal transmission of the RAM. The DFE 130 reduces ISI and ensures reliability of signal transmission. Therefore, when the RAM transmits high-speed signals, signal distortion is effectively avoided, and performance of the RAM is improved. Accordingly, the RAM shown in FIG. 1 can satisfy the requirements of transmitting high-speed signals and provide reliable signal transmission.

In some embodiments, in addition to the deserializer 120, the RAM may include only the CTLE 110 that includes a first input terminal that receives input signals for the RAM and a first output terminal communicatively connected to the deserializer 120, where the CTLE 110 is configured to perform channel gain compensation on signals received by the first input terminal and to transmit the compensated signals to the deserializer 120.

Alternatively, in addition to the deserializer 120, the RAM may include only the DFE 130 that includes a second input terminal communicatively connected to the CTLE 110 and a second output terminal communicatively connected to the deserializer 120, where the DFE 130 is configured to reduce inter-symbol interference (ISI) of the input signals.

Figure 2:
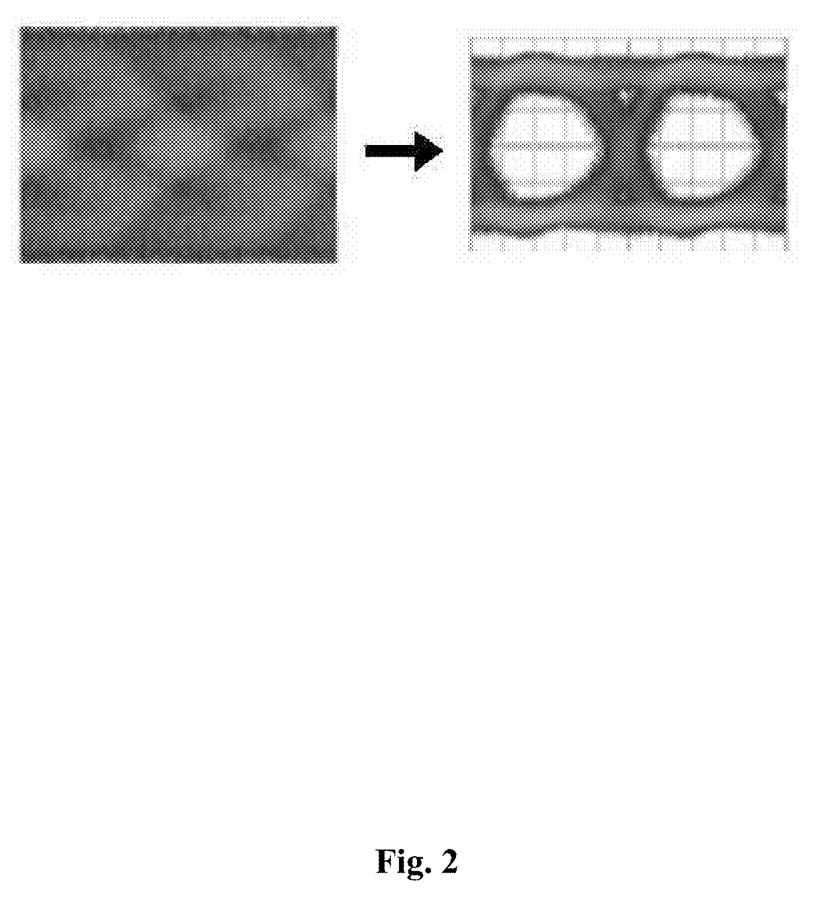
FIG. 2 shows a comparison between eye diagrams at a receiver before and after an improvement according to various embodiments of the present disclosure.

Referring to FIG. 2, a comparison between eye diagrams at a receiver before and after an improvement is shown according to various embodiments of the present disclosure. As shown in FIG. 2, the CTLE 110 in the RAM may improve performance of an eye diagram of the input signal through a linear fitting of the channel attenuation levels. An eye diagram refers to a pattern diagram observed on an oscilloscope during experimental estimation and amelioration of the performance of a transmission system. In some embodiments, the CTLE 110 may be an active CTLE, where the CTLE 110 includes a CTLE circuit.

Referring to FIG. 3, a structure diagram of a continuous-time linear equalizer (CTLE) circuit is provided according to various embodiments of the present disclosure. As shown in FIG. 3, the CTLE circuit includes:

a first branch circuit, comprising a first resistor $R_{x1}$, a first transistor M1, a second transistor M2 and a positive pole inp of the first input terminal of the CTLE, one end of the first resistor $R_{x1}$ connected to a source of the first transistor M1, the first transistor M1 having a gate connected to the positive pole inp of the first input terminal, the first transistor M1 having a drain connected to a source of the second transistor M2, the second transistor M2 having a drain that is grounded;

a second branch circuit, comprising a second resistor $R_{x2}$, a third transistor M3, a fourth transistor M4 and a negative pole inn of the first input terminal of the CTLE, one end of the second resistor $R_{x2}$ connected to a source of the third transistor M3, the third transistor M3 having a gate connected to the negative pole inn of the first input terminal, the third transistor M3 having a drain connected to a source of the fourth transistor M4, the fourth transistor M4 having a drain that is grounded;

a first controller nbias, connected both to a gate of the second transistor M2 and to a gate of the fourth transistor M4;

a third resistor R0, where one end of the third resistor R0 is connected to the first branch circuit through a first connection node located between the first and second transistors M1, M2, and the other end of the third resistor R0 is connected to the second branch circuit through a second connection node located between the third and fourth transistors M3, M4;

a positive pole outp of the first output terminal, connected to the second branch circuit through a third connection node located between the second resistor $R_{x2}$ and the third transistor M3; and a negative pole outn of the first output terminal, connected to the first branch circuit through a fourth connection node located between the first resistor $R_{x1}$ and the first transistor M1.

In the embodiments of FIG. 3, the CTLE circuit may further include:

a fifth transistor M5, having a source connected to the first branch circuit through the first connection node located between the first and second transistors M1, M2 and a drain connected to the second branch circuit through the second connection node located between the third and fourth transistors M3, M4;

a second controller gctrl, connected to a gate of the fifth transistor M5;

a first varactor diode $C_{d1}$, having a negative terminal connected to the first branch circuit through the first connection node located between the first and second transistors M1, M2;

a second varactor diode $C_{d2}$, having a negative terminal connected to the second branch circuit through the second connection node located between the third and fourth transistors M3, M4;

a third controller zctrl, connected both to a positive terminal of the first varactor diode $C_{d1}$ and to a positive terminal of the second varactor diode $C_{d2}$.

Further, each of the first varactor Cd1 and the second varactor Cd2 may include an electric transistor.

When an input signal enters the CTLE 110, the high-frequency portion of the input signal is amplified by the first transistor M1 and the third transistor M3. At the same time, the input signal passes through the first varactor diode $C_{d1}$ and the second varactor diode $C_{d2}$, where the low-frequency portion of the input signal is attenuated by tuning the third controller zctrl. In this way, a difference between attenuation levels of the high- and low-frequency portions can be compensated for, and the opening of the eye diagram at the receiver can be increased. In this case, the second transistor M2, the fourth transistor M4 and the fifth transistor M5 provides a bias voltage for the CTLE circuit, while the first resistor Rx1, the second resistor Rx2 and the third resistor R0 function as biasing resistors.

According to the embodiments of FIG. 3, the combination of the CTLE circuit and the high-speed amplifier achieves channel compensation through amplifying the high-frequency portion of the input signal via transistors while attenuating the low-frequency portion of the input signal via CTLE circuit. As a result, an increased eye-opening can be achieved at the receiver and the DFE 103 can correctly receive the signals. High reliability of the high-speed signal is thus ensured.

Figure 4:
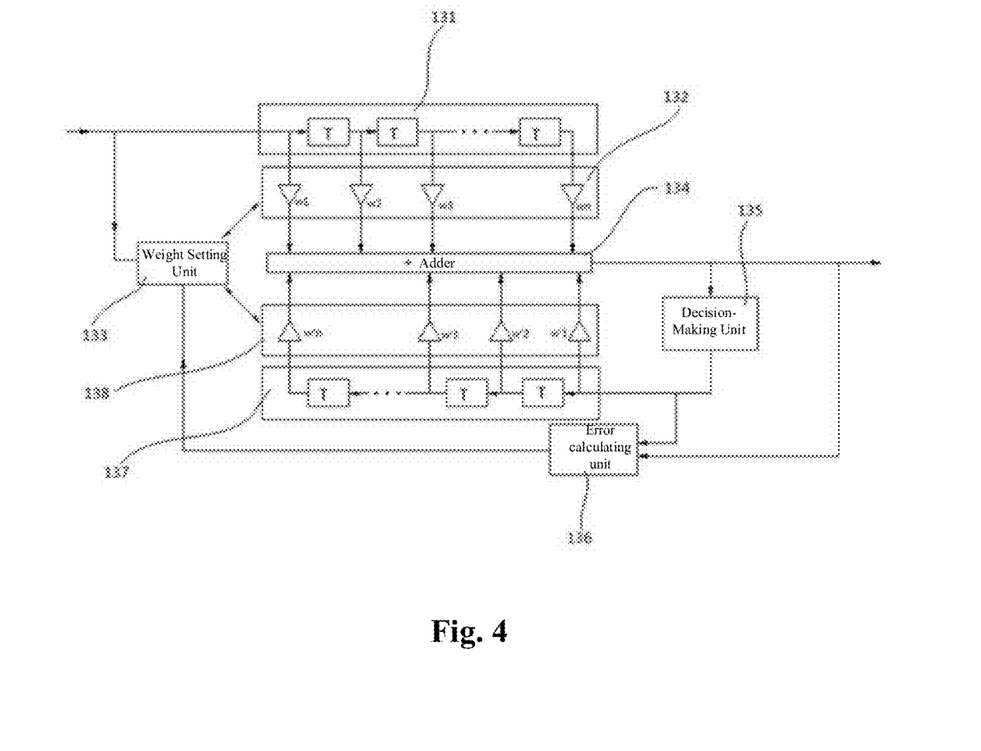
FIG. 4 is a flowchart illustrating how a decision feedback equalizer (DFE) circuit operates in accordance with various embodiments of the present disclosure.

Referring to FIG. 4, a flowchart illustrating how a decision feedback equalizer (DFE) circuit operates is provided in accordance with various embodiments of the present disclosure. As shown in FIG. 4, the DFE 130 may include:

a first delay unit 131 having an input terminal connected to a signal input terminal (e.g., the second input terminal for receiving signals from CTLE 110), the first delay unit 131 configured to delay an input signal by predetermined numbers of unit time intervals to obtain a plurality of delayed signals (e.g., this may also be referred to as sampling);

a first weighting unit 132 having an input terminal connected to an output terminal of the first delay unit 131, the first weighting unit 132 configured for weighting the delayed input signals obtained from the first delay unit 131;

a weight setting unit 133 connected to the first weighting unit 132, the weight setting unit 133 having an input terminal connected to the signal input terminal, the weight setting unit 133 configured to receive the input signal and set weights used by the first weighting unit 132 in weighting the delayed signals;

an adder 134 having an input terminal connected to an output terminal of the first weighting unit 132, the adder 134 configured to sum the weighted delayed signals to obtain a summed signal;

a decision-making unit 135 having an input terminal connected to an output terminal of the adder 134, the decision-making unit 135 configured to determine ISI on the summed signal obtained from the adder 134 and eliminate the ISI from the summed signal to obtain an ISI free signal;

an error calculating unit 136 having an input terminal connected both to an output terminal of the decision-making unit 135 and to the output terminal of the adder 134, the error calculating unit 136 also having an output terminal connected to the weight setting unit 133, the error calculating unit 136 configured to calculate a difference between the summed signal obtained from the adder 134 and the ISI free signal obtained from the decision-making unit 135, and, based on the difference, to adjust the weights set by the weight setting unit 133 for the first weighting unit 132;

a second delay unit 137 having an input terminal connected to the output terminal of the decision-making unit 135, the second delay unit 137 configured to delay the ISI free signal obtain from the decision-making unit 135 by predetermined numbers of unit time intervals to obtain a plurality of delayed ISI free signals; and a second weighting unit 138 having an input terminal connected to the output terminal of the second delay unit 137, the second weighting unit 138 also having an output terminal connected both to the input terminal of the adder 134 and to the weight setting unit 133, the second weighting unit 138 configured to weight the delayed ISI free signals, where the adder 134 is configured sum the signals output by the first weighting unit 132 and the signals output by the second weighting unit 138 (e.g., the weighted delayed ISI free signals).

In some embodiments, upon receipt of an input signal, the first delay unit 131 delays the input signal by predetermined numbers of unit time intervals and sends the delayed signals to the first weighting unit 132 for weighting the delayed signals respectively. The weight setting unit 133 sets the weighting vectors $w_1, w_2, w_3 \ldots w_n$ for the first weighting unit 132. The first weighting unit 132 weights the respectively delayed signals based on the weighting vectors $w_1, w_2, w_3 \ldots w_n$ set by the weight setting unit 133, and sends the weighted signals to the adder 134 for summing the signals.

In some embodiments, the adder 134 generates a summed signal and outputs it to the decision-making unit 135 and the error calculating unit 136. The decision-making unit 135 determines ISI of the summed signal and provides the signal after ISI-determination to the error calculating unit 136. The error calculating unit 136 calculates an attenuation difference between the summed signal from the adder 134 and the signal after ISI-determination from the decision-making unit 135, and provides the calculation result to the weight setting unit 133. At the same time, the decision-making unit 135 provides the signal after ISI-determination to the second delay unit 137.

The second delay unit 137 delays the signal after ISI-determination by predetermined numbers of unit time intervals respectively and provides the respectively delayed signals to the second weighting unit 138. The weight setting unit 133 sets, based on the difference determined by the error calculating unit 136, weighting vectors $w'_1, w'_2, w'_3 \ldots w'_n$ to be used by the second weighting unit 138. The second weighting unit 138 outputs weighted signals to the adder 134. This process is repeated until the error calculating unit 136 determines that there is no difference between the summed signal from the adder 134 and the signal after ISI-determination from the decision-making unit 135. In such a case, the adder 134 outputs the signal (e.g., the summed signal or the signal after ISI-determination).

According to these embodiments, the high-frequency portion of the input signal and noises are both amplified. The noises are removed by filtering. Equalization control is effectuated through the weights for the signals in each branch circuit. ISI between successive signals are reduced by using a decision feedback loop (e.g., the feedback loop formed by the weight setting unit 133, the decision-making unit 135 and the error calculating unit 136) such that the signal is constraint in a predetermined interval and a high reliability of the signal can be achieved. In this way, reliable transmission of high-speed signals by the RAM is guaranteed and the distortion issue is solved.

Figure 5:
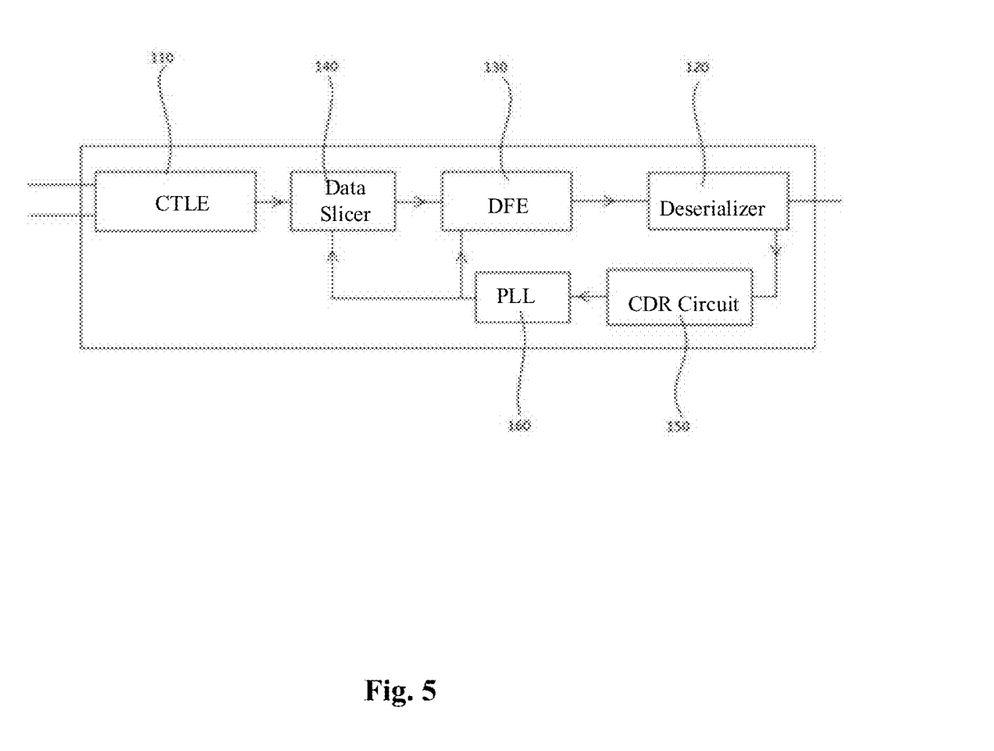
FIG. 5 is a block diagram illustrating another exemplary RAM according to various embodiments of the present disclosure.

Referring to FIG. 5, a block diagram illustrates another exemplary RAM according to various embodiments of the present disclosure. As shown in FIG. 5, in addition to the CTLE 110, the deserializer 120 and the DFE 130, a RAM may further include:

a data slicer 140 having an input terminal connected to the output terminal of the CTLE 110, the data slicer 140 also having an output terminal connected to the input terminal of the DFE 130, the data slicer 140 configured to quantify an input signal;

a clock and data recovery (CDR) circuit 150 having an input terminal connected to an output terminal of the deserializer 120, the CDR circuit 150 configured to extract phase information (e.g., a phase) from a high speed serial signal; and a phase-locked loop (PLL) 160 having an input terminal communicatively connected to an output terminal of the CDR circuit 150, and an output terminal communicatively connected to both of the data slicer 140 and the DFE 130, the PLL 160 configured to control automatic phase synchronization of different electrical signals obtained from the CDR circuit 150 (e.g., synchronize the phases of the different electrical signals).

The embodiments of FIG. 5 further improve signal reliability compared to embodiments of FIG. 1. In addition to performing amplification and ISI elimination on the high-speed transmission signals, the embodiments of FIG. 5 synchronizes the phases of the successive high-speed transmission signals, enabling the RAM immune from the distortion issue found in existing RAMs when they are used for high-speed signal transmission.

Figure 6:
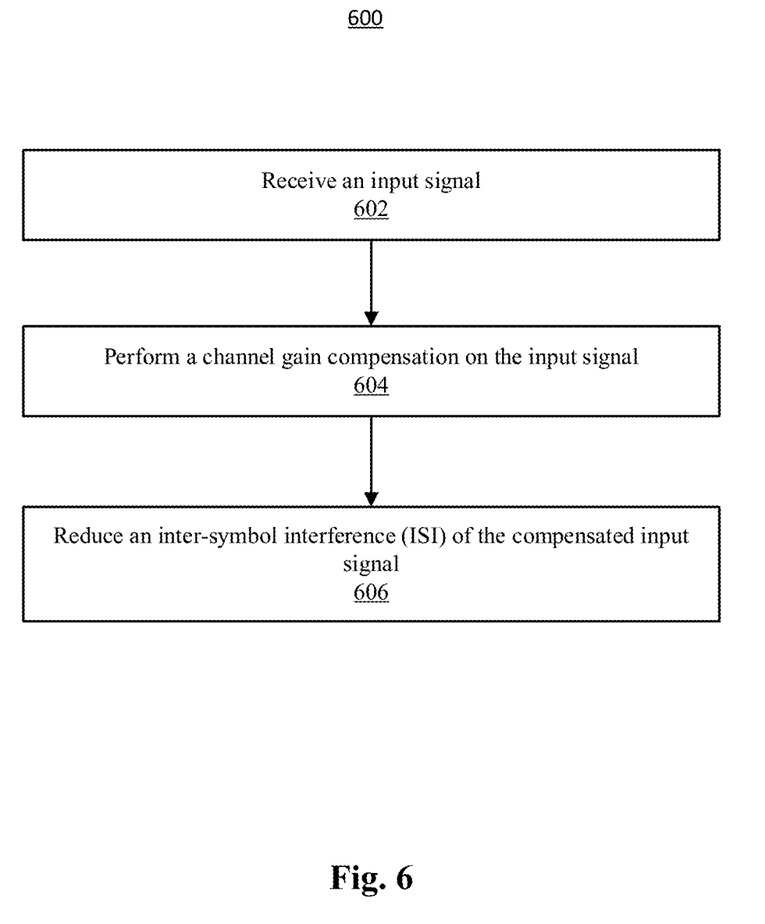
FIG. 6 is a flowchart illustrating a method implemented by a RAM according to various embodiments of the present disclosure.

Referring to FIG. 6, a flowchart is provided illustrating a method 600 implemented by a RAM according to various embodiments of the present disclosure. The method 600 may be implemented by one or more of the RAMs with reference to FIGS. 1, and 3-5.

At block 602, an input signal is received. For example, the input signal may be a signal with a high transmission speed. At block 604, a channel gain compensation may be performed on the input signal. At block 606, an inter-symbol interference (ISI) may be reduced or eliminated from the compensated input signal.

Described above are merely some specific embodiments of the present disclosure whose scope is, however, not limited to these disclosed embodiments and is intended to embrace all changes and substitutions easily devisable by those of ordinary skill in the art in light of the teachings disclosed herein. Accordingly, the scope of the present disclosure is defined by the appended claims.

What is claimed is:

1. A random access memory (RAM) comprising a deserializer, wherein the RAM further comprises:
    a continuous-time linear equalizer (CTLE) including a first input terminal that receives an input signal for the RAM and a first output terminal communicatively connected to the deserializer, the CTLE configured to perform a channel gain compensation on the input signal received by the first input terminal and to transmit the compensated input signal to the deserializer, wherein the CTLE is an active CTLE comprising a CTLE circuit, the CTLE circuit comprising:
    a first branch circuit, comprising a first resistor, a first transistor, a second transistor and a positive pole of the first input terminal of the CTLE, one end of the first resistor connected to a source of the first transistor, the first transistor having a gate connected to the positive pole of the first input terminal, the first transistor having a drain connected to a source of the second transistor, the second transistor having a drain that is grounded;
    a second branch circuit, comprising a second resistor, a third transistor, a fourth transistor and a negative pole of the first input terminal of the CTLE, one end of the second resistor connected to a source of the third transistor, the third transistor having a gate connected to the negative pole of the first input terminal, the third transistor having a drain connected to a source of the fourth transistor, the fourth transistor having a drain that is grounded;
    a first controller, connected both to a gate of the second transistor and to a gate of the fourth transistor;
    a fifth transistor, having a source connected to the first branch circuit through the first connection node located between the first and second transistors, and a drain connected to the second branch circuit through the second connection node located between the third and fourth transistors;
    a second controller, connected to a gate of the fifth transistor; and
    a decision feedback equalizer (DFE) including a second input terminal communicatively connected to the CTLE and a second output terminal communicatively connected to the deserializer, the DFE configured to reduce an inter-symbol interference (ISI) of the input signal,
    wherein the DFE comprises:
    a first delay unit having an input terminal connected to the second input terminal, the first delay unit configured to delay the input signal by predetermined numbers of unit time intervals to obtain a plurality of delayed signals;
    a first weighting unit having an input terminal connected to an output terminal of the first delay unit, the first weighting unit configured for weighting the delayed input signals;
    a weight setting unit connected to the first weighting unit, the weight setting unit having an input terminal connected to the second input terminal, the weight setting unit configured to receive the input signal and set weights used by the first weighting unit in weighting the delayed signals; and
    an adder having an input terminal connected to an output terminal of the first weighting unit, the adder configured to sum the weighted delayed signals to obtain a summed signal.

2. The RAM of claim 1, wherein the CTLE is configured to improve performance of an eye diagram of the input signal through a linear fitting of channel attenuation levels of the input signal.

3. The RAM of claim 1, wherein the CTLE circuit further comprises:
    a third resistor, where one end of the third resistor is connected to the first branch circuit through a first connection node located between the first and second transistors, and the other end of the third resistor is connected to the second branch circuit through a second connection node located between the third and fourth transistors.

4. The RAM of claim 3, wherein the CTLE circuit further comprises:
    a positive pole of the first output terminal, connected to the second branch circuit through a third connection node located between the second resistor and the third transistor; and
    a negative pole of the first output terminal, connected to the first branch circuit through a fourth connection node located between the first resistor and the first transistor.

5. The RAM of claim 1, further comprising:
    a data slicer having an input terminal connected to the output terminal of the CTLE, the data slicer also having an output terminal connected to the input terminal of the DFE, the data slicer configured to quantify the input signal;
    a clock and data recovery (CDR) circuit having an input terminal connected to an output terminal of the deserializer, the CDR circuit configured to extract phase information from the input signal; and
    a phase-locked loop (PLL) having an input terminal communicatively connected to an output terminal of the CDR circuit, and an output terminal communicatively connected to both the data slicer and the DFE, the PLL configured to control phase synchronization of different signals output by the CDR circuit.

6. The RAM of claim 1, wherein the DFE comprises:
    a decision-making unit having an input terminal connected to an output terminal of the adder, the decision-making unit configured to determine an ISI of the summed signal obtained from the adder and eliminate the ISI from the summed signal to obtain an ISI free signal; and
    an error calculating unit having an input terminal connected both to an output terminal of the decision-making unit and to the output terminal of the adder, the error calculating unit also having an output terminal connected to the weight setting unit, the error calculating unit configured to calculate a difference between the summed signal obtained from the adder and the ISI free signal obtained from the decision-making unit, and to adjust, based on the difference, the weights set by the weight setting unit for the first weighting unit.

7. The RAM of claim 6, wherein the DFE comprises:
a second delay unit having an input terminal connected to the output terminal of the decision-making unit, the second delay unit configured to delay the ISI free signal obtained from the decision-making unit by predetermined numbers of unit time intervals to obtain a plurality of delayed ISI free signals; and
a second weighting unit having an input terminal connected to the output terminal of the second delay unit, the second weighting unit also having an output terminal connected both to the input terminal of the adder and to the weight setting unit, the second weighting unit configured to weight the delayed ISI free signals,
wherein the adder is also configured to sum the signals output by the second weighting unit.

8. A random access memory (RAM) comprising a deserializer, wherein the RAM further comprises:
a continuous-time linear equalizer (CTLE) including a first input terminal that receives an input signal for the RAM and a first output terminal communicatively connected to the deserializer, the CTLE configured to perform a channel gain compensation on the input signal received by the first input terminal and to transmit the compensated input signal to the deserializer,
wherein the CTLE is an active CTLE comprising a CTLE circuit, the CTLE circuit comprising:
a first branch circuit, comprising a first resistor, a first transistor, a second transistor and a positive pole of the first input terminal of the CTLE, one end of the first resistor connected to a source of the first transistor, the first transistor having a gate connected to the positive pole of the first input terminal, the first transistor having a drain connected to a source of the second transistor, the second transistor having a drain that is grounded;
a second branch circuit, comprising a second resistor, a third transistor, a fourth transistor and a negative pole of the first input terminal of the CTLE, one end of the second resistor connected to a source of the third transistor, the third transistor having a gate connected to the negative pole of the first input terminal, the third transistor having a drain connected to a source of the fourth transistor, the fourth transistor having a drain that is grounded;
a first controller, connected both to a gate of the second transistor and to a gate of the fourth transistor;
a first varactor diode, having a negative terminal connected to the first branch circuit through the first connection node located between the first and second transistors;
a second varactor diode, having a negative terminal connected to the second branch circuit through the second connection node located between the third and fourth transistors; and
a third controller, connected both to a positive terminal of the first varactor diode and to a positive terminal of the second varactor diode.

9. The RAM of claim 8, wherein each of the first and the second varactor diodes comprises an electric transistor.

10. The RAM of claim 8, wherein the CTLE is configured to improve performance of an eye diagram of the input signal through a linear fitting of channel attenuation levels of the input signal.

11. The RAM of claim 8, wherein the CTLE circuit further comprises:

a third resistor, where one end of the third resistor is connected to the first branch circuit through a first connection node located between the first and second transistors, and the other end of the third resistor is connected to the second branch circuit through a second connection node located between the third and fourth transistors.

12. The RAM of claim 11, wherein the CTLE circuit further comprises:
a positive pole of the first output terminal, connected to the second branch circuit through a third connection node located between the second resistor and the third transistor; and
a negative pole of the first output terminal, connected to the first branch circuit through a fourth connection node located between the first resistor and the first transistor.

13. The RAM of claim 8, further comprising:
a decision feedback equalizer (DFE) including a second input terminal communicatively connected to the CTLE and a second output terminal communicatively connected to the deserializer, the DFE configured to reduce an inter-symbol interference (ISI) of the input signal.

14. The RAM of claim 13, further comprising:
a data slicer having an input terminal connected to the output terminal of the CTLE, the data slicer also having an output terminal connected to the input terminal of the DFE, the data slicer configured to quantify the input signal;
a clock and data recovery (CDR) circuit having an input terminal connected to an output terminal of the deserializer, the CDR circuit configured to extract phase information from the input signal; and
a phase-locked loop (PLL) having an input terminal communicatively connected to an output terminal of the CDR circuit, and an output terminal communicatively connected to both the data slicer and the DFE, the PLL configured to control phase synchronization of different signals output by the CDR circuit.

15. The RAM of claim 13, wherein the DFE comprises:
a first delay unit having an input terminal connected to the second input terminal, the first delay unit configured to delay the input signal by predetermined numbers of unit time intervals to obtain a plurality of delayed signals.

16. The RAM of claim 15, wherein the DFE comprises:
a first weighting unit having an input terminal connected to an output terminal of the first delay unit, the first weighting unit configured for weighting the delayed input signals;
a weight setting unit connected to the first weighting unit, the weight setting unit having an input terminal connected to the second input terminal, the weight setting unit configured to receive the input signal and set weights used by the first weighting unit in weighting the delayed signals; and
an adder having an input terminal connected to an output terminal of the first weighting unit, the adder configured to sum the weighted delayed signals to obtain a summed signal.

17. The RAM of claim 16, wherein the DFE comprises:
a decision-making unit having an input terminal connected to an output terminal of the adder, the decision-making unit configured to determine an ISI of the summed signal obtained from the adder and eliminate the ISI from the summed signal to obtain an ISI free signal; and an error calculating unit having an input terminal connected both to an output terminal of the decision-making unit and to the output terminal of the adder, the error calculating unit also having an output terminal connected to the weight setting unit, the error calculating unit configured to calculate a difference between the summed signal obtained from the adder and the ISI free signal obtained from the decision-making unit, and to adjust, based on the difference, the weights set by the weight setting unit for the first weighting unit.

* * * * *